(12) United States Patent
Casher et al.

(10) Patent No.: US 7,645,944 B2
(45) Date of Patent: Jan. 12, 2010

(54) PRINTED CIRCUIT BOARD FOR HIGH-SPEED ELECTRICAL CONNECTORS

(75) Inventors: Patrick R. Casher, North Aurora, IL (US); Kent E. Regnier, Lombard, IL (US)

(73) Assignee: Molex Incorporated, Lisle, IL (US)

( * ) Notice: Subject to any disclaimer, the term of this patent is extended or adjusted under 35 U.S.C. 154(b) by 365 days.

(21) Appl. No.: 11/261,056

(22) Filed: Oct. 28, 2005

(65) Prior Publication Data

US 2006/0091545 A1    May 4, 2006

Related U.S. Application Data

(60) Provisional application No. 60/623,665, filed on Oct. 29, 2004.

(51) Int. Cl.
*H05K 1/11* (2006.01)
*H01R 12/04* (2006.01)

(52) U.S. Cl. ........................ 174/262; 174/261
(58) Field of Classification Search .......... 174/262, 174/261
See application file for complete search history.

(56) References Cited

U.S. PATENT DOCUMENTS

| | | | |
|---|---|---|---|
| 3,411,148 A | 11/1968 | Fetterrolf et al. |
| 3,871,728 A | 3/1975 | Goodman |
| 5,157,477 A | 10/1992 | Chance |
| 5,522,727 A | 6/1996 | Saito et al. |
| 5,757,252 A | 5/1998 | Cho et al. |
| 6,350,134 B1 | 2/2002 | Fogg et al. |
| 6,384,341 B1 | 5/2002 | Rothermel et al. |
| 6,388,208 B1 | 5/2002 | Kiani et al. |
| 6,433,286 B1 | 8/2002 | Dobrenz |
| 6,528,737 B1 | 3/2003 | Kwong et al. |
| 6,534,854 B1 | 3/2003 | Fazelpur et al. |
| 6,606,011 B2 * | 8/2003 | Anthony et al. ............... 333/12 |
| 6,607,402 B2 | 8/2003 | Cohen et al. |
| 6,717,398 B2 | 4/2004 | Cartier |
| 6,767,252 B2 | 7/2004 | McGrath et al. |
| 6,824,391 B2 | 11/2004 | Mickievicz et al. |
| 6,843,657 B2 | 1/2005 | Driscoll et al. |
| 7,047,628 B2 * | 5/2006 | Lee ............................. 29/830 |
| 7,317,166 B2 * | 1/2008 | Nakamura .................. 174/262 |
| 2002/0111068 A1 | 8/2002 | Cohen et al. |

(Continued)

FOREIGN PATENT DOCUMENTS

EP    1 182 913    2/2002

(Continued)

OTHER PUBLICATIONS

International Search Report of International Application No. PCT/US2005/039147, Feb. 27, 2006.

*Primary Examiner*—Ishwarbhai B Patel
(74) *Attorney, Agent, or Firm*—Stephen L. Sheldon

(57) ABSTRACT

A printed circuit board exit arrangement is disclosed for use in high speed connector mounting applications. A ground plane has one or more open areas formed in it that surround pairs of signal vias formed in the board that are used to convey differential signals. The ground plane has a thin interconnecting strip, or web, that passes between the two vias of each pair and which divides the open areas into sub-areas, each sib-area containing a single via.

14 Claims, 5 Drawing Sheets

U.S. PATENT DOCUMENTS

| | | |
|---|---|---|
| 2002/0179332 A1* | 12/2002 | Uematsu et al. .............. 174/262 |
| 2004/0037050 A1* | 2/2004 | Nakayama et al. .......... 361/736 |
| 2004/0039859 A1 | 2/2004 | He et al. |
| 2004/0150970 A1 | 8/2004 | Lee |
| 2005/0011676 A1 | 1/2005 | Barr et al. |
| 2005/0151597 A1 | 7/2005 | Brunker et al. |
| 2005/0151604 A1 | 7/2005 | Brunker et al. |
| 2005/0156690 A1 | 7/2005 | Brunker et al. |
| 2005/0168303 A1 | 8/2005 | Brunker et al. |
| 2005/0174191 A1 | 8/2005 | Brunker et al. |
| 2005/0201065 A1 | 9/2005 | Regnier et al. |
| 2005/0202722 A1 | 9/2005 | Regnier et al. |
| 2006/0139117 A1 | 6/2006 | Brunker et al. |
| 2006/0189212 A1 | 8/2006 | Avery et al. |

FOREIGN PATENT DOCUMENTS

| | | |
|---|---|---|
| EP | 1 239 552 | 9/2002 |
| JP | 04268787 | 2/1994 |
| JP | 2001-053397 | 2/2001 |

* cited by examiner

US 7,645,944 B2

PRINTED CIRCUIT BOARD FOR HIGH-SPEED ELECTRICAL CONNECTORS

REFERENCE TO RELATED APPLICATIONS

This application claims priority of prior U.S. Provisional Patent Application No. 60/623,665, filed Oct. 29, 2004.

BACKGROUND OF THE INVENTION

The present invention relates generally to high speed electrical connectors and, more particularly, to printed circuit boards that connect or otherwise support electrical connectors and which provide signal paths for differential signals between different circuit boards and components thereon.

In backplane connections, an electrical connector is typically used to form a connection between circuits on one circuit board and another circuit board. The boards are usually oriented at right angles. Such types of backplane systems are used in the telecommunications area and in the data transfer area. In these areas, it is desirable to control both impedance and cross-talk between differential signal paths. These two aspects may be controlled in transmission lines, such as electrical cables, and on circuit boards, where it is possible to lay out complex geometric patterns of conductive traces on the circuit board.

It is therefore desirable to maintain preselected distances between differential signal paths or traces as well as the distances between the signal paths and an associated ground reference(s). The present invention is directed to such patterns and the like.

SUMMARY OF THE INVENTION

It is therefore a general object of the preset invention to provide an improved circuit board pattern disposed about a pair of vias that are used for differential signal applications.

Another object of the present invention is to provide a circuit board pattern for use with differential signal applications for vias of the circuit board wherein the circuit board includes at least one ground plane layer that extends along a plane of the circuit board, and the ground plane layer including an "anti-pad" area encompassing the pair of differential signal vias, the anti-pad including an area wherein the conductive material of the ground plane layer is removed, and the ground plane layer including a conductive element that extends through the anti-pad between the pair of differential signal vias, thereby dividing the anti-pad into two distinct removed areas, with each of the areas encompassing a single differential signal via.

Still another object of the present invention is to provide the anti-pad interconnecting element along a line that extends between the two differential signal vias so that the conductive element bisects the anti-pad into two symmetrical halves.

Yet a further object of the present invention is to provide the anti-pad interconnecting element along a path between the two differential signal vias so that it divides the anti-pad into two, non-symmetrical halves.

Still yet another object of the present invention is to provide a ground trace routing channel that extends through the anti-pad and provides an additional ground layer for the two differential signal traces that are routed out from the vias.

These and other objects of the present invention are provided by way of the structure of the invention. In accordance with one embodiment of the present invention, a circuit board has a plurality of vias formed in it and these vias are intended for use in differential signal applications. The vias take the form of holes that extend through the circuit board and the inner walls of the via are plated to establish electrical connections between the vias, circuits on the circuit boards and terminal tails portions inserted into the vias. Each pair of vias is spaced apart from each other so as to accommodate a pair of terminal tail portions of a connector mounted to the circuit board.

The circuit board includes one or more ground plane layers which consist of a conductive coating, such as a copper layer that extends in its own plane within or on a top or bottom surface of the circuit board. The vias are exposed on the surfaces of the circuit board, and an area of the ground plane that surrounds the pair of vias is removed to form an open area. This open, removed area is termed by us and those in the art as an "anti-pad" and it encompasses a pair of differential signal vias. Such an anti-pad is know in the art, such as those illustrated in U.S. Pat. No. 6,607,402, issued Aug. 19, 2003 and U.S. Pat. No. 6,767,252, issued Jul. 27, 2004, and these anti-pads, typically oval in shape; constitute a relatively large area surrounding the pair of vias which is free of the conductive ground plane layer. However, the present invention is a departure from the prior art in that it utilizes a strip, or thin conductive element, that interconnects two edges of the anti-pad and effectively divides each such anti-pad into two halves. This interconnecting element provides an electrical ground path between the differential signal vias without adversely affecting the coupling of the two vias.

In one embodiment, the thin conductive element divides the anti-pad into two distinct and symmetrical anti-pad halves. In another embodiment, the conductive element divides the anti-pad into two distinct asymmetrical halves. Another ground layer of the circuit board, adjacent to the ground layer that harbors the split anti-pads, may be provided within the circuit board to provide a reference ground path that extends within its own layer to provide a pathway that is adjacent to the signal route out pathway from the differential signal vias;

The routing of the interconnecting conductive element that extends between the two differential signal vias may also include at least one turn or angle so that the interconnecting element takes a path that follows the routing of an adjacent signal layer routing which extends out and away from the differential signal vias.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which.

DETAILED DESCRIPTION OF THE PREFERRED EMBODIMENTS

The present invention is directed to new printed circuit board patterns, and particularly launch patterns which are found at the apertures in the circuit boards that receive conductive pins from connectors which are mounted to the circuit board. Specifically, the present invention is directed to improved launch areas for circuit boards that utilize differential signal traces.

Figure 1A:
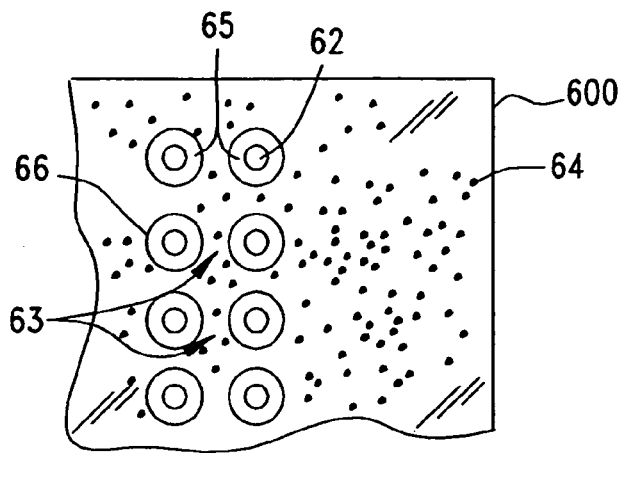
FIG. 1A is a diagrammatic plan view of a prior art circuit board signal launch.
Figure 1B:
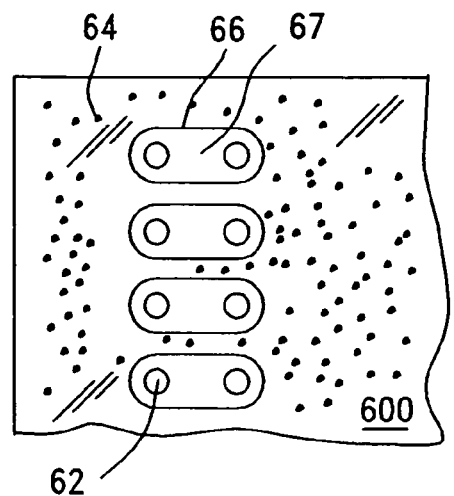
FIG. 1B is a diagrammatic plan view of another prior art circuit board signal launch

FIGS. 1A and 1B show known styles of circuit boards that are used with differential signals. FIG. 1A illustrates a portion of a circuit board, or backplane 600, to which a connector would be attached. There are columns of holes, or apertures 62, that are formed in the circuit board 600 and these apertures are commonly referred to in the art as "vias". These vias 62 typically extend completely through the circuit board 600 and have their inner surfaces plated so that they define a conductive path that extends completely through the circuit board. The contact tails of a connector are inserted into the via holes to mount a connector to the circuit board 600. Typically, there are one or more ground plane layers 64 included in the circuit board 60. Small portions, or annulas 66, of the ground plane layers are removed around the vias 62 to leave exposed areas 66 in order to avoid shorting out connections made in the vias. However, in this known configuration, there is ground plane material deposited between the holes 62 and this intervening material is shown at 63. It should be noted that this intervening material 63 follows a natural path around the open annulas 66. This intervening material is large as compared to the size of the vias, and the annulas are small in width or thickness.

FIG. 1B shows another printed circuit board 600 that is intended for use with a differential signal connector. In this structure, as described more fully in U.S. Pat. No. 6,607,402, issued Aug. 19, 2003, the ground plane layer 64 is structured, such as by etching to leave an exposed, or open area around pairs of vias 62 that form a differential pair. This open area is much larger in size than the annulas of FIG. 1A. In this way, there is no ground plane layer (or any conductive material) present between the two holes of a differential pair. Rather, the intervening area 67 that lies between the two differential signal vias 62 is completely devoid of conductive material and this exposed area forms what we term in this description and what is referred to in the art as an "anti-pad", which is an opening in the ground plane layer 64 that entirely encompasses the two vias, preferably a pair of differential signal vias 62. The anti-pad areas are illustrated in FIG. 1B as oval in configuration.

Figure 2:
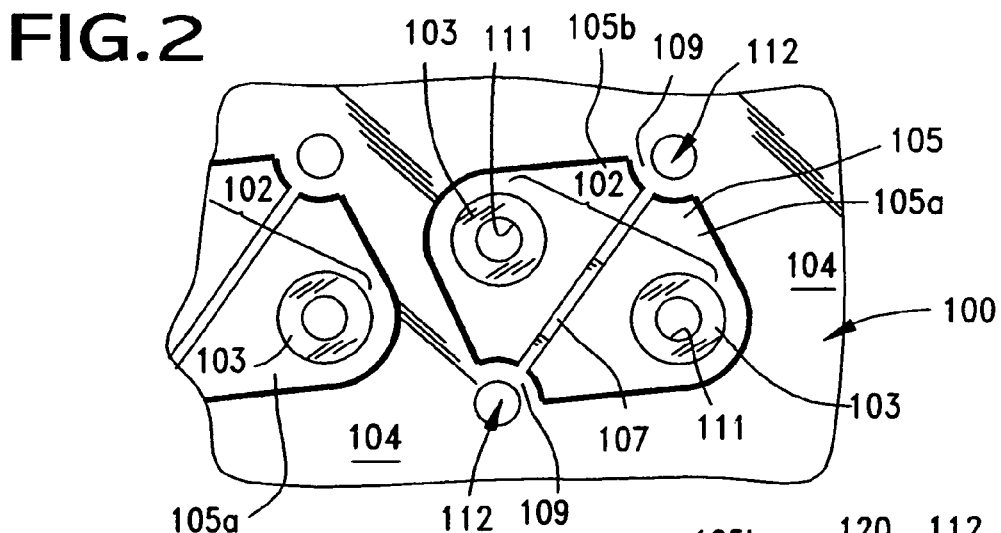
FIG. 2 is a plan diagrammatic view of a circuit board constructed in accordance with the principles of the present invention, and illustrating a ground plane layer having an anti-pad that is split into two parts by means of an intervening conductive connecting strip.

FIG. 2 is a top plan view of a circuit board 100 illustrating a pair of vias 102, preferably vias that are used to connect to terminal tail portions of a connector mounted to the circuit board. These terminal tail portions typically will carry differential signals from the circuit board and through the connector. As can be seen, there is a ground reference plane 104 disposed as a conductive layer on or within the circuit board 100. The ground plane is typically established by laminating a thin layer of depositing such a layer onto a layer of insulating material, such as epoxy, fiberglass, FR4 or the like. An area 105 of the conductive ground layer is removed in a conventional manner such as by etching or the like to create a large opening in the ground layer that encompasses the two differential signal vias.

We refer to this open area in this description as an "anti-pad" and for purposes of illustration, this anti-pad 105 is bounded by the thick black line in FIG. 2. However, whereas the anti-pad of FIG. 1B completely encompasses the two differential signal vias 62, the anti-pad structure of FIG. 2 is split into two, somewhat symmetrical halves by a conductive interconnecting element, in the form of a bisecting linear trace 107 that extends between the two differential signal vias. Each such differential signal via may include, as shown, a conductive annula 103 that surrounds the via and which is connected to the conductive plating on the inner walls 111 of each via.

In FIG. 2, the path of this bisecting trace is shown as a linear one and it extends between two annular portion 109 that surround vias 112 which are designated as ground vias for receipt of designated ground terminal tails. In the configuration and path shown in FIG. 2, the trace 107 may be considered as bisecting the anti-pad 105 into two equal, and preferably symmetrical halves, or parts, 105a, 105b. This conductive trace 107 forms a web that extends through the anti-pads, and preferably through the centers of the anti-pads 105 to provide a ground signal path between the two differential signal vias without adversely effecting the impedance of the transmission line defined by the two differential signal vias. This thin interconnecting web 107 can be seen to extend in a line between the two ground vias 112 of the ground plane 104.

This conductive ground signal path is utilized to improve localized signal integrity because is provide a short electrical path through the open area surrounding the vias, minimizing the length that ground signals must travel during operation of the differential signal vias. Additionally, the thin interconnecting web runs between (when viewed from above or below) the two differential signal via exit traces as shown, it being understood that the signal traces are located in a plane different than that of the ground reference plane. This structure maintains a reference member in close proximity to the differential signal traces within the large open area so that coupling is maintained between the signal traces and the reference ground plane. As such, there is no danger of signals traveling along these signal traces being primarily coupled to a ground that is a relatively larger distance away, which could create an area for coupling with a large signal to ground distance which could cause a slowdown in the operation of high speed an frequency signal transmission.

Figure 3:
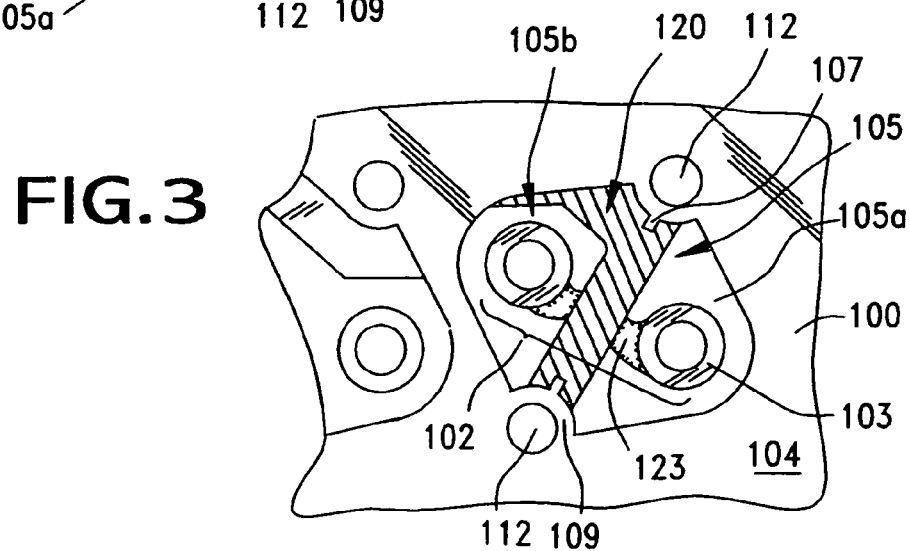
FIG. 3 is the same view as FIG. 2, but with the interconnecting conductive strip removed for clarity and the ground routing channel formed as a layer that lies adjacent to the ground plane layer of FIG. 2.

FIG. 3 is the same view as FIG. 2, but in FIG. 3 the interconnecting web 107 has been removed for clarity in order to view the conductive layers of the circuit board that lie beneath the ground plane layer 104 of the circuit board 100. The lower layers of the circuit board may be seen to include a conductive pathway 120 that also extends between the two differential signal vias and this serves as a conductive ground reference routing channel or path that follows the path of the signal traces 123 that exit from the two differential signal vias 102. This conductive path 120 is much wider than the interconnecting webs 107 and although it lies adjacent underneath the ground plane layer, it is separated therefrom by way of an insulating layer such as is known and used in the art of printed circuit board construction. This pathway 120 follows the path that the differential signal traces 125 will take as they exit from or are routed out from the differential signal vias.

Figure 4:
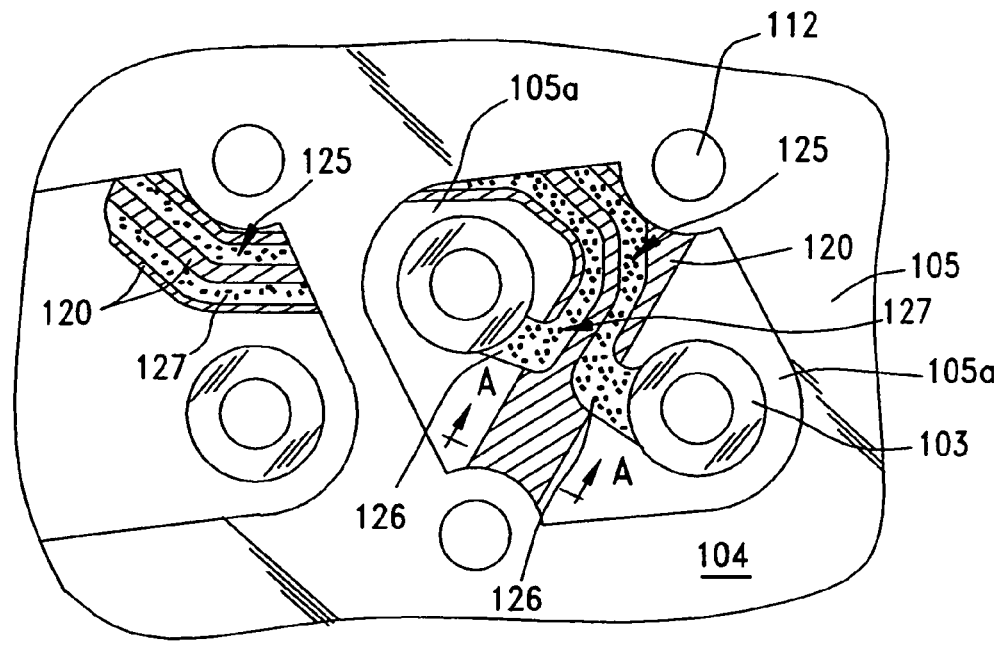
FIG. 4 is the same view as FIG. 3, also with the interconnecting conductive strip removed for clarity, but with the differential signal via route out channels shown superimposed on the ground routing channel of FIG. 3.
Figure 4A:
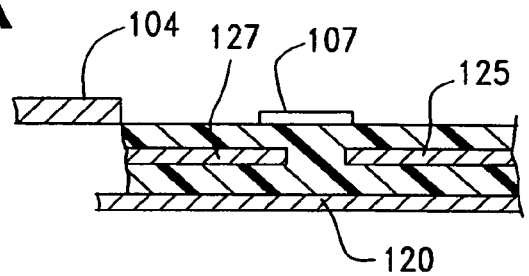
FIG. 4A is a detailed sectional view of the circuit board of FIG. 4, taken along the extent of lines A-A thereof.

As seen best in FIG. 4, the signal traces 125 extend from their respective vias toward each other first by way of stub, or flag, portions 126 that taper down to thin portions 127 that extend in a predesignated pattern. The ground pathway 120 is preferably formed as a wide path, that extends completely underneath the two signal traces 125, and most preferably extend slightly over the outside edges of the signal traces 125, as seen best in FIG. 4A, which also shown the intervening board material separating the layers in the vertical direction. As such, they provide a ground reference for the two signal traces. The signal traces 125 may be considered as flanking the thin interconnecting strip 107.

Figure 5:
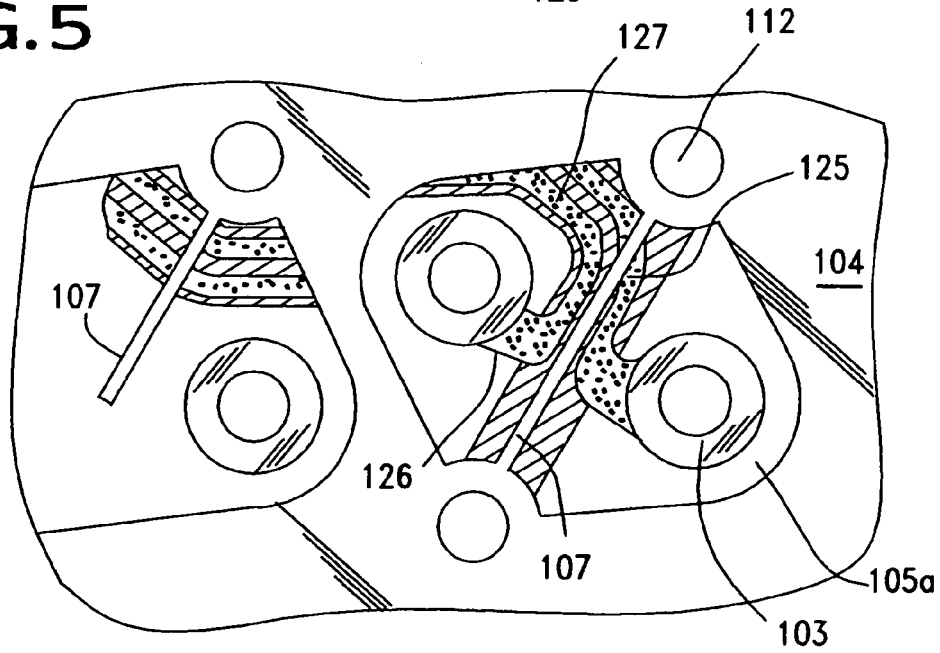
FIG. 5 is the same view as FIG. 4, but with the interconnecting conductive element shown in place extending across the anti-pad and between the two differential signal vias.

FIG. 5 illustrates the interconnecting web 107 shown in place and its location with respect to the ground channel route routing path 120 and its location relative to the differential signal traces 125, one of which passes under the interconnecting web 107.

Figure 6A:
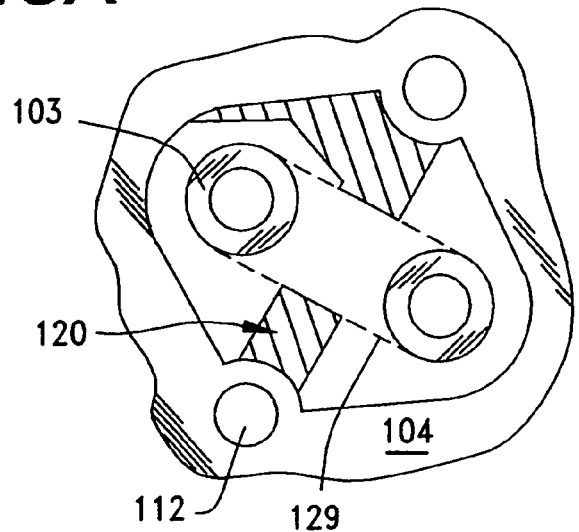
FIG. 6A is a plan diagrammatic view of one variation of the ground routing channel with two stub ends that may be used in circuit board layouts of the present invention.
Figure 6B:
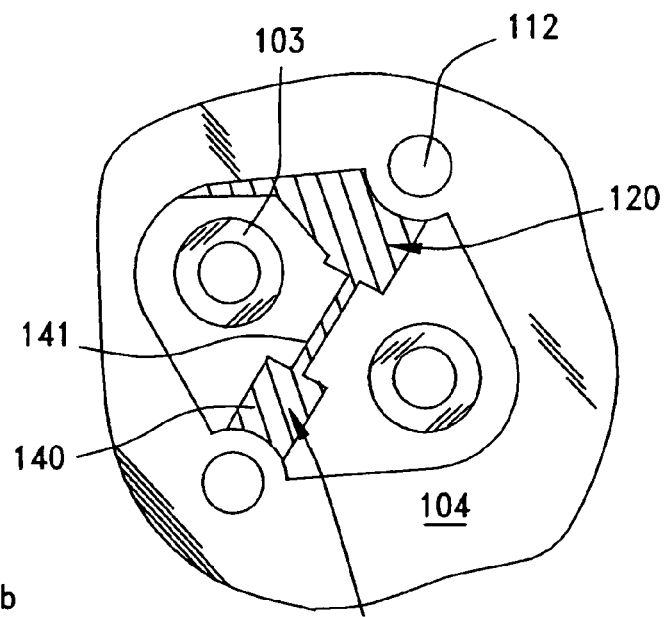
FIG. 6B is a plan diagrammatic view of another variation of the ground routing channel with two stub ends interconnected by their own thin interconnecting strip that may be used in circuit board layouts of the present invention.

FIGS. 6A and 6B illustrate another plan view of a circuit board structure constructed in accordance with the principles of the present invention, which shows variations of the ground routing channel 120. In the embodiment illustrated, the ground routing channel will taper down from wide extents 140 to a thin interconnecting web 141 that preferably has the same width as the interconnecting element 107 for the upper ground plane layer 104 and which also preferably passes through the center between the two differential signal vias. In FIG. 6A, there is no such interconnecting web 141 for the ground routing channel 120, and it can be seen that they terminate in alignment with each other along the dashed lines 129 of FIG. 6A, which represent an extension as can be seen of the aligned diameters of the two differential signal vias. They further terminate outside of the center area between the two signal vias 102, so that if a tangent were drawn along their terminating faces, the tangent would preferably run outside of the inner walls of the vias as shown.

Figure 7:
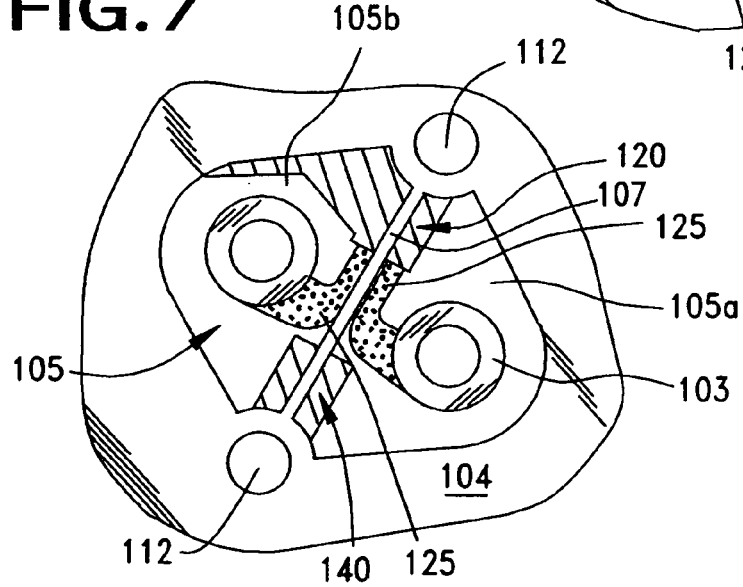
FIG. 7 is the same view as FIG. 6A, but with the ground plane layer conductive interconnecting element and the differential signal via route outs superimposed upon the ground routing channel.

FIG. 7 illustrates the same view as FIG. 6B, but with the ground plane interconnecting web 107 of the upper ground layer shown extending between both the differential signal vias 102. It also shows the differential signal traces 125 that exit from the vias 103. As can be determined from the Figure, the interconnecting web 107 lies above and preferably aligned with the web 141 of the ground layer disposed beneath in the circuit board. The differential signal traces 125 that trace a path from the vias to elsewhere on the circuit board are also shown and these flank the interconnecting webs 107, 141.

Figure 8A:
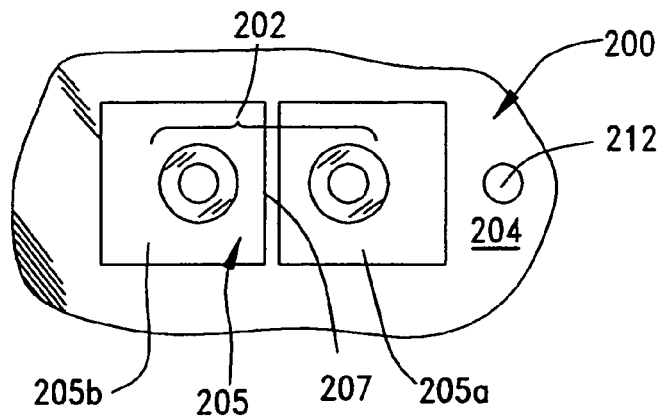
FIG. 8A is a plan diagrammatic view of a circuit board incorporating another design in accordance with the principles of the present invention, wherein the anti-pad is generally rectangular and having been split into two square or rectangular anti-pad halves by the intervening conductive interconnecting element of the ground plane layer.
Figure 8B:
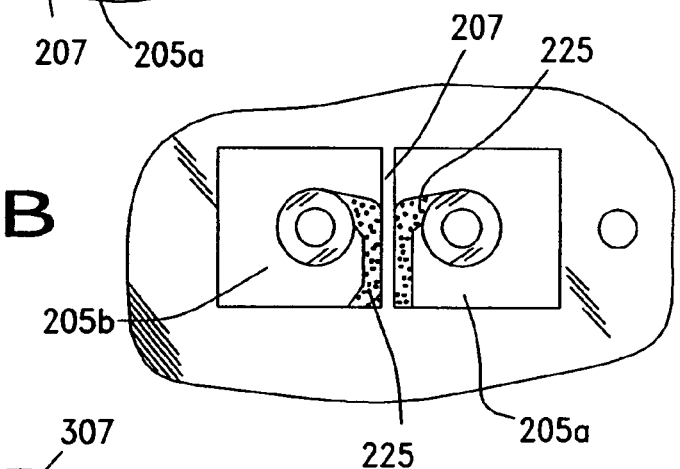
FIG. 8B is the same view as FIG. 8A, but illustrating the differential signal via route outs.

FIG. 8A is a view of another circuit board 200 with a different design, and is a plan diagrammatic view of a circuit board incorporating another design in accordance with the principles of the present invention, wherein the anti-pad is generally rectangular and having been split into two square or rectangular anti-pad halves by the intervening conductive interconnecting element of the ground plane layer. The overall anti-pad 205 is generally rectangular and is split into two square or rectangular anti-pad halves 205a, 205b by the intervening conductive interconnecting element 207 of the ground plane layer 204 that extends between the two differential signal vias 202. FIG. 8B is the same view as FIG. 8A, but illustrating the differential signal traces 225 as they are routed out from their respective vias 202.

Figure 9A:
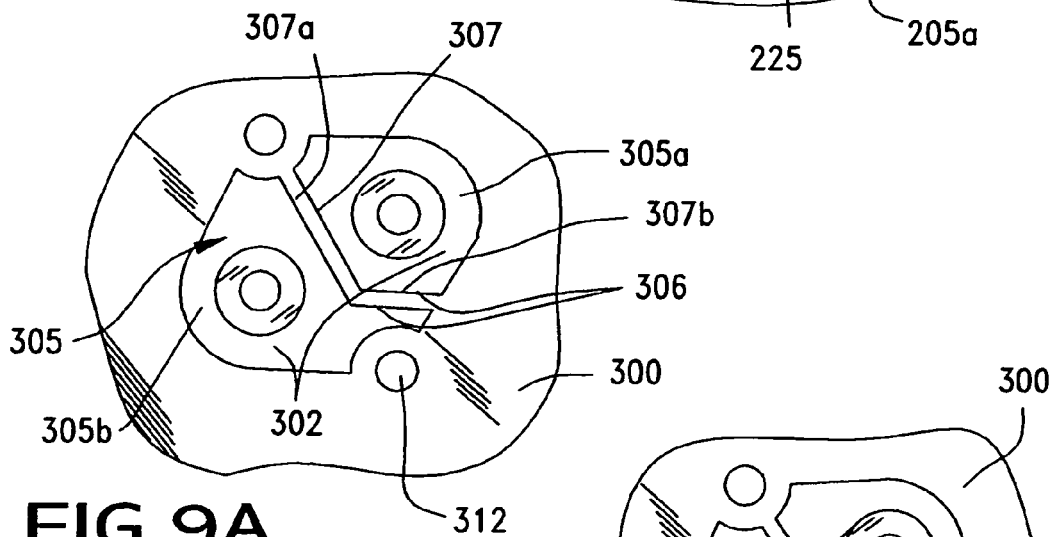
FIG. 9A is a plan diagrammatic view of another embodiment of a circuit board layout constructed in accordance with the principles of the present invention in which the conductive interconnecting ground plane element extends through the anti-pad in a manner so as to divide it into two distinct, but asymmetrical parts.
Figure 9B:
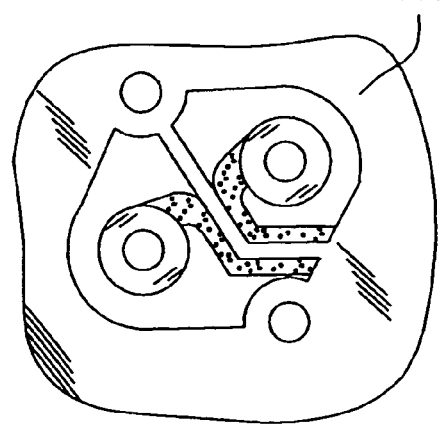
FIG. 9B is the same view as FIG. 9A, but with two differential signal traces extending along and underneath the thin interconnecting element, and leading from the circuit board vias to another are of the circuit board.

FIG. 9A is another embodiment of a circuit board 300 with a layout constructed in accordance with the principles of the present invention in which the conductive interconnecting ground plane element 307 extends through the anti-pad 305 in a bifurcated manner, that is it includes an bend or angle 306 that defines two different extents 307a, 307b of the interconnecting element 307. This element 307 divides the anti-pas 305 into two asymmetrical and unequal parts 305a, 305b. FIG. 9B illustrates the differential signal traces that leave from their respective vias in alignment with the interconnecting element.

Figure 10A:
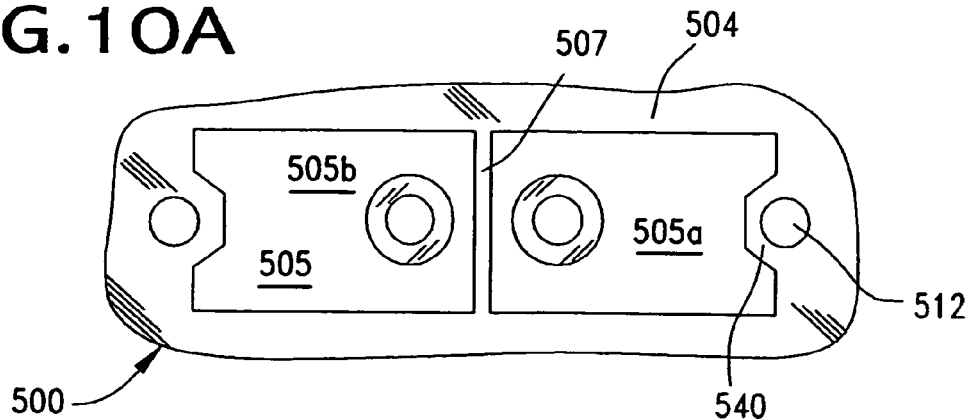
FIG. 10A is a plan diagrammatic view of another embodiment of a circuit board layout constructed in accordance with the principles of the present invention in which the overall anti-pad is relatively large and rectangular in configuration with notches to accommodate the associated ground plane vias, and in which the conductive interconnecting element divides the anti-pad into two symmetrical halves.
Figure 10B:
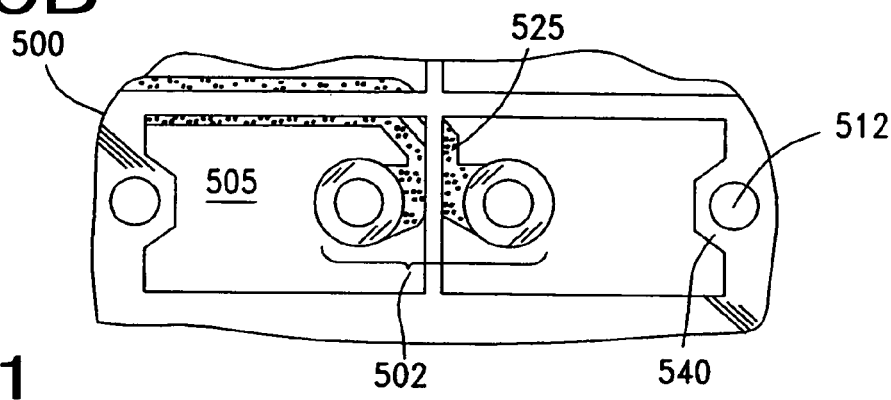
FIG. 10B is the same view as FIG. 10B, but illustrating the route out paths of the signal traces from the two differential signal vias.

FIG. 10A is a variation of the circuit board layout of FIGS. 8A and 8B, in which the anti-pads 505 are relatively large and rectangular in configuration with end notches 540 to accommodate the associated ground plane vias 512, and in which the conductive interconnecting element 507 divides the anti-pad into two symmetrical halves 505a, 505b. FIG. 10B illustrates the route out paths of the signal traces 525 from the two differential signal vias 502.

Figure 11:
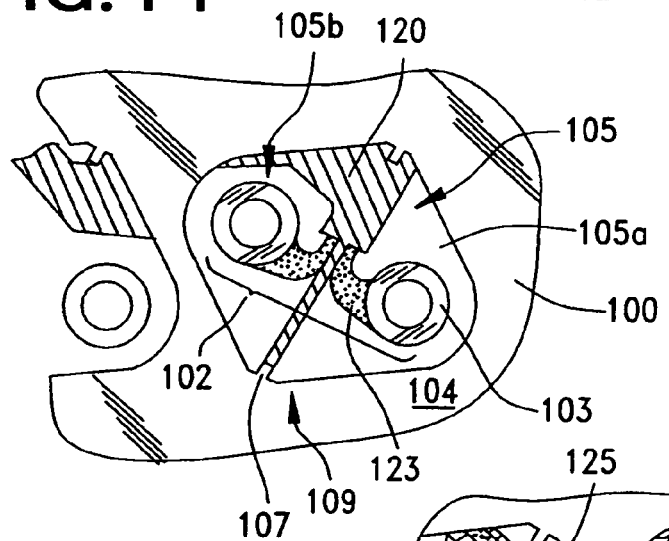
FIG. 11 is a plan view of another embodiment of the invention that is similar to that shown in FIG. 3 (also with the interconnecting strip removed from clarity), but which utilizes a thin strip that extends from the stub end of a ground routing channel; and, FIG. 12 is the same view as FIG. 11, but with the differential signal channel paths illustrated.

FIG. 11 illustrates another embodiment and in the Figure, the interconnecting web 107 has been removed for clarity. In this structure, the ground routing area 120 is disposed beneath the layer in which the differential signal traces 125 are disposed and further underneath the top reference ground plane layer 104. The ground routing area 120 has a wide stub that extends into the area beneath the differential signal traces and further includes a thin portion that extends from the stub portion in spaced-apart alignment with the top interconnecting web 107.

Figure 12:
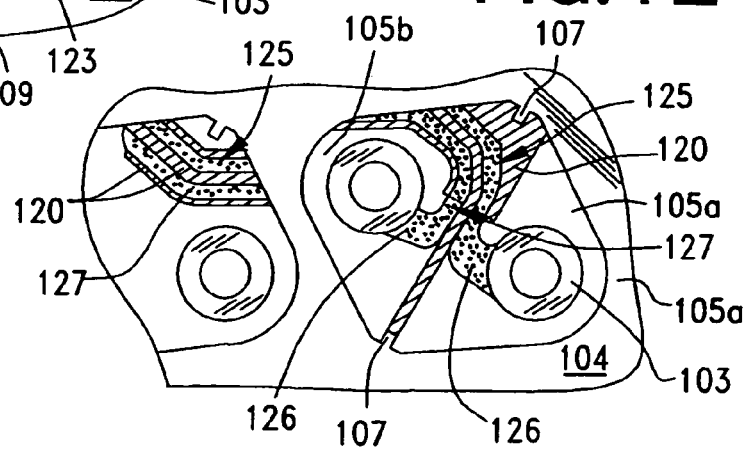

As shown best in FIG. 12, the differential signal traces initially extend out along the sides of the interconnecting web 107 and then above the ground routing area 120 where the differential signal traces narrow down to their thin trace portions 127.

While the preferred embodiment of the invention have been shown and described, it will be apparent to those skilled in the art that changes and modifications may be made therein without departing from the spirit of the invention, the scope of which is defined by the appended claims.

The invention claimed is:

1. A printed circuit board, comprising:
at least one pair of apertures configured to receive the contact tail portions of a connector; and
at least one ground plane layer, wherein the ground plane layer is spaced within the circuit board at a location between opposing surfaces of the circuit board, and for each pair of apertures corresponding to a differential signal pair, an area surrounding the pair of apertures that is free of the ground plane layer and the ground plane layer having a thin conductive interconnecting element with a substantially uniform width that extends through the area surrounding the differential signal pair, wherein the interconnecting element separates the area free of the ground plane layer into two distinct parts.

2. The printed circuit board of claim 1, wherein the area surrounding the pair of apertures free of the ground plane layer has an oval configuration.

3. The printed circuit board of claim 1, wherein the conductive interconnecting element separates the area free of the ground plane layer surrounding the pair of apertures into two symmetrical areas.

4. The printed circuit board of claim 3, wherein the two symmetrical areas are equally sized.

5. The printed circuit board of claim 1, wherein the interconnecting element extends in a linear fashion through the area free of the ground plane layer surrounding the pair of apertures.

6. The printed circuit board of claim 1, wherein the apertures are plated with a conductive material.

7. The printed circuit board of claim 1, wherein the circuit board includes a conductive ground routing area disposed in the circuit board underneath and spaced apart from the interconnecting element.

8. The printed circuit board of claim 7, wherein the conductive ground routing area extends beneath the thin interconnecting element and has at least one portion thereof which is wider than the thin interconnecting portion.

9. A printed circuit board, comprising:
at least one pair of apertures configured to receive the contact tail portions of a connector;
at least one ground plane layer, and for each pair of apertures corresponding to a differential signal pair, an area surrounding the pair of apertures that is free of the ground plane layer and the ground plane layer having a thin conductive interconnecting element with a substantially uniform thickness that extends through the area surrounding the differential signal pair, wherein the interconnecting element separates the area free of the ground plane layer into two distinct parts; and
an another pair of apertures, wherein the another pair of apertures are aligned along a routing channel that extends in alignment with the conductive interconnecting element.

10. A printed circuit board comprising:
a first surface;
a second surface opposing the first surface;
a plurality of plated vias extending from one of the first and second surface toward the other of the first and second surface and configured to receive terminal tail portions of a connector, the plurality of plated vias being separated into a first groups of vias and a distinct second group of vias, the first group of vias being dedicated as ground vias and the second group of vias being dedicated as signal vias, the second group of vias being arranged in a plurality of via pairs, each of the plurality of via pairs corresponding to a differential signal pair;
a ground plane layer, the ground plane including a plurality of openings formed therein, wherein each of the plurality of openings surrounds one of the plurality of via pairs and has an edge that extends around the respective via pair; and
a thin conductive element positioned in each of the plurality of openings and extending between the vias that form the via pair, wherein the conductive element has a substantially uniform width, the conductive element extending from two sides of the edge of the opening so as to divide the opening into two distinct parts and define a ground path for each of the openings that extends between the via pair positioned in the opening.

11. The printed circuit board of claim 10, wherein the ground plane layer is positioned between the first surface and the second surface of the circuit board.

12. The printed circuit board of claim 10, wherein the ground plane is a first ground plane, the circuit board further comprising a second ground plane.

13. The printed circuit of claim 10, wherein the distinct parts of each of the plurality of openings is substantially symmetric.

14. The printed circuit of claim 10, wherein the conductive element has a first portion and a second portion, the second portion at an angle with respect to the first portion.

* * * * *